(12) United States Patent
Suzuki et al.

(10) Patent No.: US 10,345,329 B2
(45) Date of Patent: Jul. 9, 2019

(54) INERTIAL FORCE SENSOR

(71) Applicant: Panasonic Intellectual Property Management Co., Ltd., Osaka (JP)

(72) Inventors: Hirotsugu Suzuki, Ishikawa (JP); Yoichi Nakayoshi, Fukui (JP); Masaki Nakamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 152 days.

(21) Appl. No.: 15/512,782

(22) PCT Filed: Jul. 5, 2016

(86) PCT No.: PCT/JP2016/003202
§ 371 (c)(1),
(2) Date: Mar. 20, 2017

(87) PCT Pub. No.: WO2017/006562
PCT Pub. Date: Jan. 12, 2017

(65) Prior Publication Data
US 2017/0299623 A1 Oct. 19, 2017

(30) Foreign Application Priority Data
Jul. 7, 2015 (JP) .................................. 2015-135764

(51) Int. Cl.
*G01P 15/18* (2013.01)
*G01P 21/00* (2006.01)
(Continued)

(52) U.S. Cl.
CPC ........ *G01P 15/034* (2013.01); *G01C 19/5747* (2013.01); *G01C 19/5769* (2013.01);
(Continued)

(58) Field of Classification Search
CPC .... G01P 15/123; G01P 15/0802; G01P 15/18; G01P 15/122; G01P 15/12; G01P 15/032; G01P 15/034; G01P 15/036; G01P 21/00
See application file for complete search history.

(56) References Cited

U.S. PATENT DOCUMENTS 5,458,000 A * 10/1995 Burns .................. G01D 3/0365
73/497
5,537,882 A * 7/1996 Ugai ..................... G01L 9/0054
338/42

(Continued)

FOREIGN PATENT DOCUMENTS

JP    2008-170294    7/2008

OTHER PUBLICATIONS

International Search Report dated Sep. 20, 2016 in International Application No. PCT/JP2016/003202.

*Primary Examiner* — Helen C Kwok
(74) *Attorney, Agent, or Firm* — Wenderoth, Lind & Ponack, L.L.P.

(57) ABSTRACT

An inertial force sensor includes: an acceleration detection element; a temperature sensor that detects an ambient temperature of the acceleration detection element; a bridge circuit that processes an output signal from the acceleration detection element; an AD converter that converts an analog signal output from the bridge circuit into a digital signal, and outputs the digital signal; a calculation circuit that performs calculation on the output signal from the AD converter; and a storage that stores correction data for correcting a variation in the output signal from the AD converter due to a temperature change. The correction data are coefficients of a formula expressed by a calibration curve that is a quadratic or higher-degree curve, and the storage stores, as the correction data, the coefficients of the calibration curve of each (Continued)

of a plurality of patterns that differ between a predetermined temperature or more and less than the predetermined temperature.

5 Claims, 5 Drawing Sheets

(51) Int. Cl.
G01P 15/12 (2006.01)
G01P 15/03 (2006.01)
G01C 19/5747 (2012.01)
G01C 19/5769 (2012.01)
G01P 3/02 (2006.01)
G01P 15/08 (2006.01)
G01C 19/5776 (2012.01)
G01P 15/125 (2006.01)
H03M 1/08 (2006.01)
H03M 1/12 (2006.01)

(52) U.S. Cl.
CPC ............ *G01C 19/5776* (2013.01); *G01P 3/02* (2013.01); *G01P 15/0802* (2013.01); *G01P 15/123* (2013.01); *G01P 15/125* (2013.01); *G01P 15/18* (2013.01); *G01P 21/00* (2013.01); *G01P 2015/0842* (2013.01); *H03M 1/089* (2013.01); *H03M 1/12* (2013.01)

(56) References Cited

U.S. PATENT DOCUMENTS

| | | | |
|---|---|---|---|
| 5,719,333 A * | 2/1998 | Hosoi | G01P 15/008 73/514.05 |
| 2003/0006822 A1 | 1/2003 | Murakami et al. | |
| 2004/0007064 A1* | 1/2004 | Sakaguchi | G01P 15/123 73/488 |
| 2005/0011260 A1* | 1/2005 | Arndt | G01P 15/008 73/204.26 |
| 2008/0033679 A1* | 2/2008 | Yamada | G01P 15/123 702/95 |
| 2009/0071248 A1* | 3/2009 | Sakaguchi | G01P 1/023 73/514.33 |
| 2009/0133466 A1* | 5/2009 | Kitamura | G01P 15/18 73/1.37 |
| 2011/0238363 A1* | 9/2011 | Nakamura | G01C 19/56 702/141 |
| 2011/0239784 A1* | 10/2011 | Ohsato | G01L 5/162 73/862.044 |
| 2012/0191398 A1* | 7/2012 | Murakami | G01C 19/5776 702/99 |
| 2014/0149061 A1 | 5/2014 | Ohta et al. | |
| 2014/0174148 A1 | 6/2014 | Naruse et al. | |
| 2014/0358317 A1 | 12/2014 | Nishikawa et al. | |
| 2015/0131695 A1 | 5/2015 | Kobayashi | |
| 2015/0276790 A1* | 10/2015 | Yonezawa | G01P 15/18 73/514.32 |
| 2016/0003865 A1* | 1/2016 | Brisson | G01P 15/131 73/514.36 |

* cited by examiner

FIG. 6 - PRIOR ART

FIG. 7 - PRIOR ART
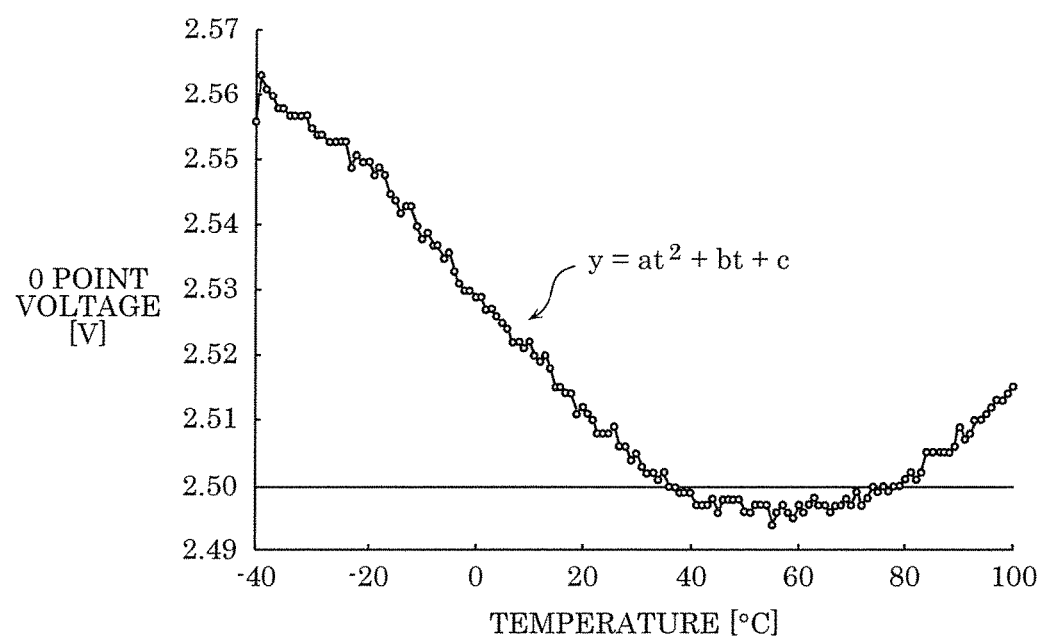

… (1)

INERTIAL FORCE SENSOR

TECHNICAL FIELD

The present invention relates to an inertial force sensor used in a vehicle, a mobile terminal, and the like.

BACKGROUND ART

FIG. 6 is a block diagram illustrating the circuit structure of conventional inertial force sensor 100A.

As illustrated in FIG. 6, conventional inertial force sensor 100A is, for example, an angular velocity sensor, and includes oscillator 1, drive circuit 7, detection circuit 8, adder 9, temperature sensor 10, A/D converter 11, and storage 12.

Oscillator 1 is a crystal oscillator in tuning fork form. Drive electrode 2 made of gold is provided on each of the four side surfaces of oscillator 1. Monitor electrode 3 made of gold is provided on each of the front and back surfaces of oscillator 1. GND electrode 4 made of gold is provided on the inner side surface of oscillator 1, and first detection electrode 5 and second detection electrode 6 made of gold are provided on the outer side surface of oscillator 1.

Drive circuit 7 receives the charge of one monitor electrode 3 of oscillator 1 as input, and outputs a drive signal to drive electrode 2 in oscillator 1.

Detection circuit 8 receives the charge generated by the Coriolis force in first detection electrode 5 and the charge generated by the Coriolis force in second detection electrode 6 in oscillator 1 as input, and outputs an angular velocity signal as an output signal.

Adder 9 adds a correction signal to the angular velocity signal output from detection circuit 8.

Temperature sensor 10 is located near oscillator 1, and detects the temperature near oscillator 1.

A/D converter 11 converts an analog signal output from temperature sensor 10 into a digital signal.

Storage 12 is memory such as EEPROM. Storage 12 stores correction data for correcting the error of the output signal output from detection circuit 8.

The following describes the operation of conventional inertial force sensor 100A having the aforementioned structure.

When an alternating-current (AC) voltage is applied to drive electrode 2 in oscillator 1, oscillator 1 resonates, and a charge is generated in monitor electrode 3 in oscillator 1. The charge generated in monitor electrode 3 is fed to drive electrode 2 via drive circuit 7, and the oscillation of oscillator 1 is adjusted to a constant amplitude.

When oscillator 1 rotates at angular velocity ω about the longitudinal central axis of oscillator 1 in a state where oscillator 1 is bending-oscillating at velocity v in the oscillation direction, the Coriolis force of F=2 mV×ω is generated in oscillator 1. This Coriolis force causes the generation of a charge in first detection electrode 5 and second detection electrode 6. The charge generated in first detection electrode 5 and second detection electrode 6 is fed to detection circuit 8, and an angular velocity signal is output from detection circuit 8 as an output signal.

Consider the case where inertial force sensor 100A (angular velocity sensor) is installed in an engine room in a vehicle and the temperature near inertial force sensor 100A changes from −40° C. to 100° C.

First, the temperature near inertial force sensor 100A is changed from −40° C. to 100° C. so that the conditions are the same as those in the engine room in the vehicle, and the output signal from temperature sensor 10 at each temperature is fed to CPU 14 via A/D converter 11 and at the same time the output signal from detection circuit 8 in a state where no angular velocity is provided is fed to CPU 14. CPU 14 plots the output signal at each temperature so that the output signal of detection circuit 8 at each temperature (for example, every 1° C.) is always 2.5 V which is zero output, to obtain a correction curve. CPU 14 then approximates the correction curve by a quadratic curve (quadratic function) as illustrated in FIG. 7, to calculate correction coefficients. The correction coefficients are, for example, $a=7\times10^{-6}$, $b=9\times10^{-4}$, and $c=2.5$, and stored in storage 12 together with the correction curve as correction data.

In the case where angular velocity is applied to the vehicle (not illustrated) provided with inertial force sensor 100A set in this way, detection circuit 8 in inertial force sensor 100A outputs an angular velocity signal.

In this case, CPU 14 in vehicle control device 13 in the vehicle calculates a correction signal (correction value) based on the correction data stored in storage 12 in inertial force sensor 100A, and D/A converter 15 converts the calculated correction signal into an analog signal. Adder 9 adds the analog correction signal to the angular velocity signal output from detection circuit 8. The output signal from detection circuit 8, that is, the angular velocity signal, is corrected in this way.

For example, Patent Literature (PTL) 1 is known as related art document information for the invention of this application.

CITATION LIST

Patent Literature

PTL 1: Japanese Unexamined Patent Application Publication No. 2008-170294

SUMMARY OF THE INVENTION

Technical Problem

However, since conventional inertial force sensor 100A approximates the correction curve for correcting the error caused by the temperature change by the quadratic curve, accurate correction is possible in the quadratic curve but correction of higher accuracy cannot be performed. Correction using a higher-degree curve for correction of higher accuracy requires a larger circuit size and a larger amount of circuit computation.

To solve the problem stated above, the present invention has an object of providing an inertial force sensor capable of higher-degree correction of higher accuracy without an increase in circuit size and an increase in computation amount.

Solution to Problem

One aspect of an inertial force sensor according to the present invention includes: a detection element; a temperature sensor that detects an ambient temperature of the detection element; a bridge circuit that processes an output signal from the detection element; an AD converter that converts an analog signal output from the bridge circuit into a digital signal, and outputs the digital signal; a calculation circuit that performs calculation on the output signal from the AD converter; and a storage that stores correction data for correcting a variation in the output signal from the AD converter due to a temperature change, wherein the correction data is a calibration curve that is a quadratic or higher-degree curve, and the storage stores coefficients of the calibration curve of each of a plurality of patterns that differ between a predetermined temperature or more and less than the predetermined temperature.

With this structure, the coefficients for the calibration curve expressed by the quadratic or higher-degree curve can be changed between the predetermined temperature or more and less than the predetermined temperature. This enables quartic or higher-degree correction in a pseudo manner. Higher-degree correction of higher accuracy can thus be achieved with a small circuit size and a small amount of computation.

Moreover, the inertial force sensor further includes a selector provided downstream of the storage, wherein the selector selects specific coefficients from the coefficients of the calibration curve of each of the plurality of patterns stored in the storage, depending on the temperature detected by the temperature sensor.

With this structure, the specific coefficients can be easily selected from the coefficients of the calibration curve of each of the plurality of patterns.

Moreover, the inertial force sensor further includes a temperature correction calculator provided downstream of the selector, wherein the temperature correction calculator calculates a correction value for correcting the output signal from the AD converter, based on the temperature detected by the temperature sensor and the specific coefficients selected by the selector.

With this structure, the correction value for correcting the output signal from the AD converter can be calculated.

Moreover, the calculation circuit corrects the output signal from the AD converter, based on the correction value calculated by the temperature correction calculator.

With this structure, the output signal from the AD converter can be corrected based on the correction value.

Advantageous Effect of Invention

According to the present invention, it is possible to realize an inertial force sensor capable of higher-degree correction of higher accuracy without an increase in circuit size and an increase in computation amount.

BRIEF DESCRIPTION OF DRAWINGS

FIG. 6 is a block diagram illustrating the circuit structure of a conventional inertial force sensor.

FIG. 7 is a diagram illustrating a calibration curve for correcting the output signal of the conventional inertial force sensor.

DESCRIPTION OF EXEMPLARY EMBODIMENT

Figure 1:
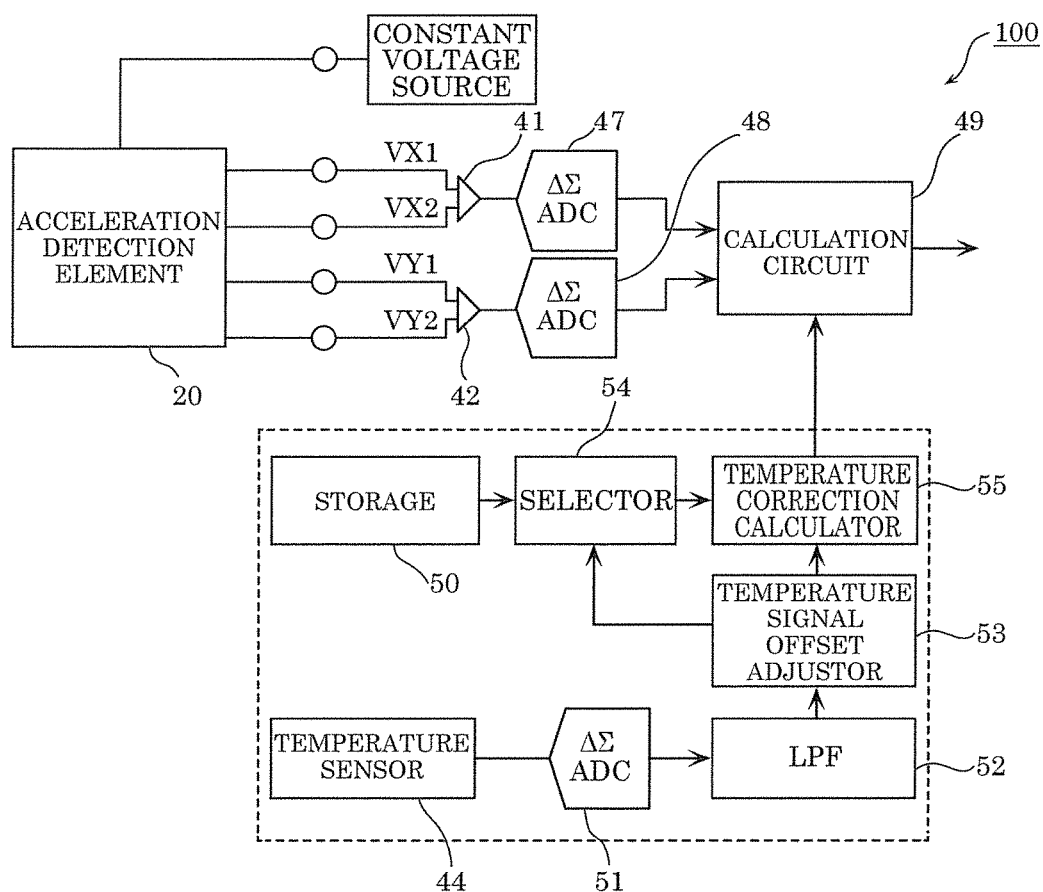
FIG. 1 is a block diagram illustrating the circuit structure of an inertial force sensor according to an embodiment of the present invention.

The following describes inertial force sensor 100 according to an embodiment of the present invention with reference to drawings. The embodiment described below shows a specific example of the present invention. The numerical values, shapes, materials, structural elements, the arrangement and connection of the structural elements, etc. shown in the following embodiment are mere examples, and do not limit the scope of the present invention. Of the structural elements in the embodiment described below, the structural elements not recited in any one of the independent claims representing the broadest concepts of the present invention are described as optional structural elements.

Each drawing is a schematic and does not necessarily provide precise depiction. The scale, etc. in the drawings are therefore not necessarily consistent. The substantially same structural elements are given the same reference marks throughout the drawings, and repeated description is omitted or simplified.

In the description and the drawings, X axis, Y axis, and Z axis represent the three axes of a three-dimensional orthogonal coordinate system.

FIG. 1 is a block diagram illustrating the circuit structure of inertial force sensor 100 according to an embodiment of the present invention.

As illustrated in FIG. 1, inertial force sensor 100 includes acceleration detection element 20, temperature sensor 44, first bridge circuit 41, second bridge circuit 42, first $\Delta\Sigma$ AD converter (delta-sigma AD converter) 47, second $\Delta\Sigma$ AD converter 48, calculation circuit 49, and storage 50.

Inertial force sensor 100 in this embodiment further includes third $\Delta\Sigma$ AD converter 51, digital low-pass filter 52, temperature signal offset adjustor 53, selector 54, and temperature correction calculator 55.

Figure 2:
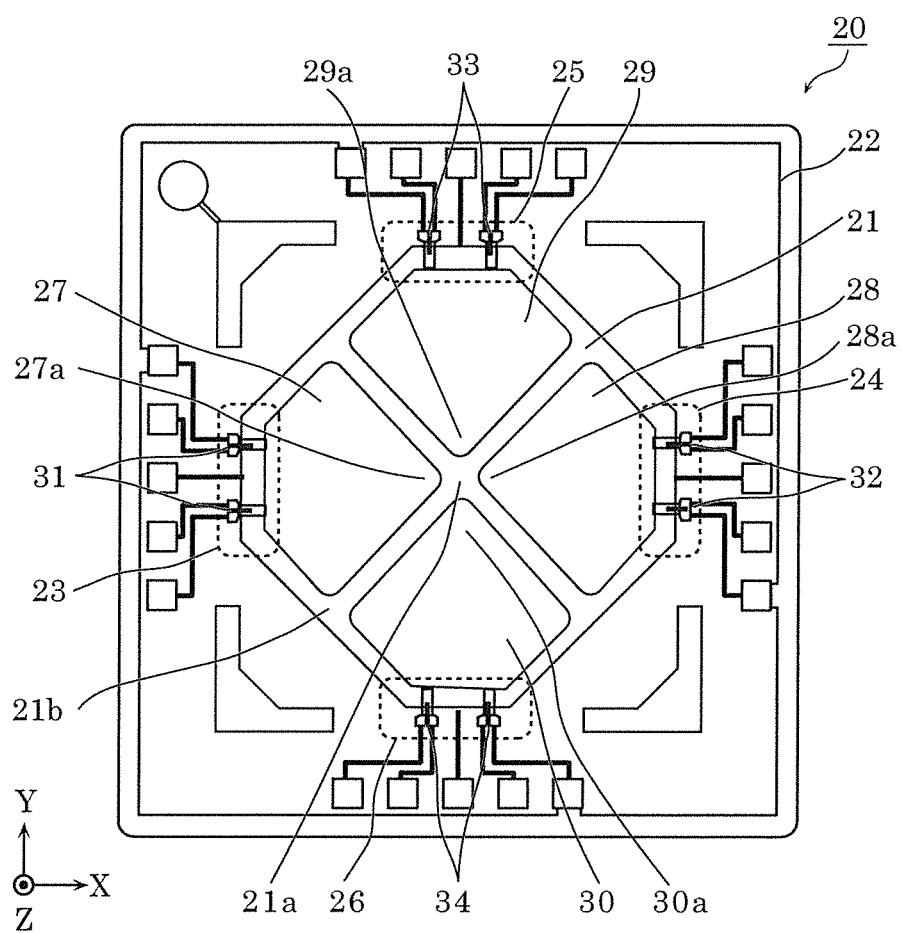
FIG. 2 is a top view of an acceleration detection element in the inertial force sensor.

FIG. 2 is a top view of acceleration detection element 20 in inertial force sensor 100.

Acceleration detection element 20 is an example of a detection element. As illustrated in FIG. 2, acceleration detection element 20 includes: frame 22 inside which hollow region 21 is formed; and beams 23, 24, 25, and 26 each of which has one end connected to frame 22 and extends to hollow region 21. Acceleration detection element 20 also includes: weights 27, 28, 29, and 30 respectively connected to the other ends of beams 23, 24, 25, and 26; and first acceleration detectors 31 and 32 respectively provided on beams 23 and 24 to detect acceleration in the X-axis direction and second acceleration detectors 33 and 34 respectively provided on beams 25 and 26 to detect acceleration in the Y-axis direction. Weights 27 and 28 are opposite to each other, and weights 29 and 30 are opposite to each other. Each of first acceleration detectors 31 and 32 and second acceleration detectors 33 and 34 may be a detection device of strain resistance type, capacitance type, or the like. The use of a piezoresistor as the detection device of strain resistance type improves the sensitivity of acceleration detection element 20. The use of a thin film resistor employing an oxide film strain resistor as the detection device of strain resistance type improves the temperature characteristics of acceleration detection element 20.

Figure 3:
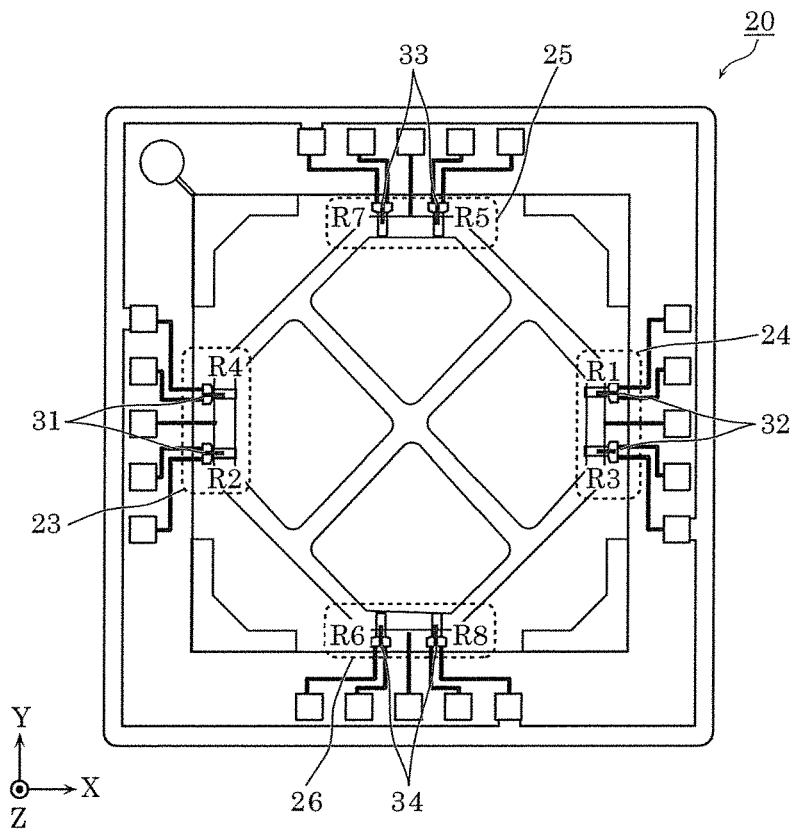
FIG. 3 is a top view of the acceleration detection element in the inertial force sensor.

FIG. 3 is a top view of acceleration detection element 20, and illustrates a circuit example for describing an acceleration detection method. FIG. 3 illustrates the detection device arrangement in the case where the detection device of strain resistance type is used as each of first acceleration detectors 31 and 32 and second acceleration detectors 33 and 34.

As illustrated in FIG. 3, strain resistors R2 and R4 are arranged as first acceleration detector 31, strain resistors R1 and R3 are arranged as first acceleration detector 32, strain resistors R5 and R7 are arranged as second acceleration detector 33, and strain resistors R6 and R8 are arranged as second acceleration detector 34.

First bridge circuit 41 and second bridge circuit 42 each process an output signal from acceleration detection element 20. In this embodiment, analog signals are output from first bridge circuit 41 and second bridge circuit 42.

Figure 4A:
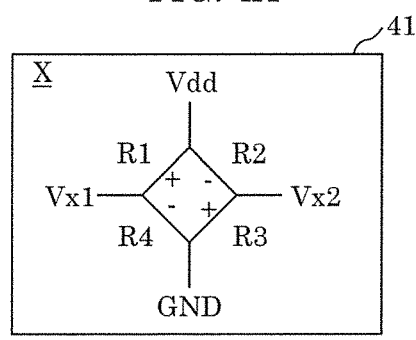
FIG. 4A is a circuit diagram of a first bridge circuit that detects acceleration in the X-axis direction in the inertial force sensor.

FIG. 4A is a circuit diagram of first bridge circuit 41 that detects acceleration in the X-axis direction in inertial force sensor 100.

As illustrated in FIG. 4A, in first bridge circuit 41, resistors R1, R2, R3, and R4 are bridge-connected, and acceleration in the X-axis direction is detected by applying a voltage between one pair of opposite connection points Vdd and GND and detecting a voltage between the other pair of connection points Vx1 and Vx2. In detail, first bridge circuit 41 processes the output signals from first acceleration detectors 31 and 32 in acceleration detection element 20 to detect acceleration in the X-axis direction, and outputs the detected acceleration to first ΔΣ AD converter 47.

Figure 4B:
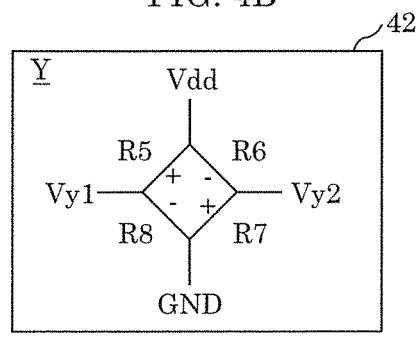
FIG. 4B is a circuit diagram of a second bridge circuit that detects acceleration in the Y-axis direction in the inertial force sensor.

FIG. 4B is a circuit diagram of second bridge circuit 42 that detects acceleration in the Y-axis direction in inertial force sensor 100.

As illustrated in FIG. 4B, in second bridge circuit 42, resistors R5, R6, R7, and R8 are bridge-connected, and acceleration in the Y-axis direction is detected by applying a voltage between one pair of opposite connection points Vdd and GND and detecting a voltage between the other pair of connection points Vy1 and Vy2. In detail, second bridge circuit 42 processes the output signals from second acceleration detectors 33 and 34 in acceleration detection element 20 to detect acceleration in the Y-axis direction, and outputs the detected acceleration to second ΔΣ AD converter 48.

Temperature sensor 44 detects the ambient temperature of acceleration detection element 20. Temperature sensor 44 is situated at a position where the ambient temperature of acceleration detection element 20 is detectable. Temperature sensor 44 outputs the detected temperature information to third ΔΣ AD converter 51. For example, an analog signal related to the temperature information is output from temperature sensor 44.

First ΔΣ AD converter 47 is an example of an AD converter, and converts the analog signal output from first bridge circuit 41 as the output signal into a digital signal and outputs the digital signal. In detail, first ΔΣ AD converter 47 converts the acceleration in the X-axis direction detected by first bridge circuit 41 from an analog signal to a digital signal.

Second ΔΣ AD converter 48 is an example of an AD converter, and converts the analog signal output from second bridge circuit 42 as the output signal into a digital signal and outputs the digital signal. In detail, second ΔΣ AD converter 48 converts the acceleration in the Y-axis direction detected by second bridge circuit 42 from an analog signal to a digital signal.

Calculation circuit 49 performs calculation on the output signals from first ΔΣ AD converter 47 and second ΔΣ AD converter 48. In this embodiment, calculation circuit 49 corrects the signal of the acceleration in the X-axis direction from first ΔΣ AD converter 47 and the signal of the acceleration in the Y-axis direction from second ΔΣ AD converter 48 based on the temperature information from temperature sensor 44, and outputs the correction result. In detail, calculation circuit 49 corrects the output signals from first ΔΣ AD converter 47 and second ΔΣ AD converter 48, using a correction value calculated by temperature correction calculator 55.

Storage 50 stores correction data for correcting variations in the output signals from first ΔΣ AD converter 47 and second ΔΣ AD converter 48 due to a temperature change. The correction data stored in storage 50 is a calibration curve that is a quadratic or higher-degree curve. Storage 50 stores the coefficients of the calibration curve of each of a plurality of patterns that differ between a predetermined temperature or more and less than the predetermined temperature.

The calibration curve is an approximate curve expressed by a monomial or polynomial formula. In the case where the calibration curve is a quadratic curve, for example, the calibration curve is expressed by $y = a \times t^2 + b \times t + c$. The coefficients of the calibration curve are the coefficients (a, b, c) in the formula. The calibration curve is not limited to a quadratic curve (quadratic function), and may be a cubic or higher-degree curve. In the case where the calibration curve is a cubic curve, for example, the calibration curve is expressed by $y = a \times t^3 + b \times t^2 + c \times t + d$ or $y = a \times t^3 + b \times t^2 + c \times t$, and the coefficients are a, b, c, and d, or a, b, and c. In this embodiment, the calibration curve is a cubic curve of $y = a \times t^3 + b \times t^2 + c \times t$.

Storage 50 is nonvolatile memory such as ROM as an example. Storage 50 is not limited to nonvolatile memory, and may be another type of memory, e.g. volatile memory such as RAM. Storage 50 may also store information other than the correction data (calibration curve) and the coefficients of the calibration curve.

Third ΔΣ AD converter 51 is provided downstream of temperature sensor 44. Third ΔΣ AD converter 51 converts the analog signal related to the temperature information output from temperature sensor 44 as the output signal into a digital signal, and outputs the digital signal.

Digital low-pass filter 52 is provided downstream of third ΔΣ AD converter 51. Digital low-pass filter 52 removes any noise signal from the digital signal related to the temperature information output from third ΔΣ AD converter 51.

Temperature signal offset adjustor 53 is provided downstream of digital low-pass filter 52. Temperature signal offset adjustor 53 performs offset adjustment on the signal related to the temperature information output from temperature sensor 44. In this embodiment, temperature signal offset adjustor 53 performs offset adjustment on the signal related to the temperature information from temperature sensor 44 from which any noise signal has been removed by digital low-pass filter 52 and which has been converted into a digital signal by third ΔΣ AD converter 51.

Selector 54 is provided downstream of storage 50. Selector 54 selects specific coefficients from the coefficients of the calibration curve of each of the plurality of patterns stored in storage 50, depending on the temperature detected by temperature sensor 44.

Temperature correction calculator 55 is provided downstream of selector 54 and temperature signal offset adjustor 53. Temperature correction calculator 55 calculates a correction value for correcting the output signals from first ΔΣ AD converter 47 and second ΔΣ AD converter 48, based on the temperature information from temperature sensor 44 and the specific coefficients selected by selector 54.

The operation of inertial force sensor 100 having the aforementioned structure is described below.

The case of detecting acceleration in the X-axis direction is described first.

In the case where acceleration is applied to acceleration detection element 20 in the positive direction of the X-axis direction, weight 28 moves downward and weight 27 moves upward. As a result, tensile stress acts on the upper surface of beam 24, and the resistance of first acceleration detector 32 increases. Moreover, compressive stress acts on the upper surface of beam 23, and the resistance of first acceleration detector 31 decreases. First bridge circuit 41 accordingly outputs the output signal corresponding to the acceleration in the X-axis direction, as illustrated in FIG. 4A.

The case of detecting acceleration in the Y-axis direction is described next.

In the case where acceleration is applied to acceleration detection element 20 in the positive direction of the Y-axis direction, weight 29 moves downward and weight 30 moves upward. As a result, tensile stress acts on the upper surface of beam 25, and the resistance of second acceleration detector 33 increases. Moreover, compressive stress acts on the upper surface of beam 26, and the resistance of second acceleration detector 34 decreases. Second bridge circuit 42 accordingly outputs the output signal corresponding to the acceleration in the Y-axis direction, as illustrated in FIG. 4B.

Actually, acceleration of two axes, i.e. the X-axis direction and the Y-axis direction, is applied to acceleration detection element 20 (inertial force sensor 100). The output signal of the acceleration in the X-axis direction output from first bridge circuit 41 is converted into a digital signal by first ΔΣ AD converter 47. Likewise, the acceleration (acceleration signal) in the Y-axis direction output from second bridge circuit 42 is converted into a digital signal by second ΔΣ AD converter 48.

Calculation circuit 49 corrects, based on the temperature information output from temperature sensor 44, the acceleration signal in the X-axis direction output from first ΔΣ AD converter 47 as a digital signal and the acceleration signal in the Y-axis direction output from second ΔΣ AD converter 48 as a digital signal, and outputs the correction result.

Consider the case where the ambient temperature of inertial force sensor 100 changes.

First, inertial force sensor 100 is put in a temperature tank (not illustrated), and the ambient temperature is changed from −50° C. to 150° C. In a state where no acceleration is applied, the temperature at which the output signal from calculation circuit 49 is zero is determined and set as a reference temperature.

Next, the change of the output signal when the temperature is increased or decreased is measured with respect to the reference temperature, and correction data for correcting the change is stored, for example, in storage 50 beforehand.

For example, the output signal at each temperature (e.g. every 1° C.) when the temperature is increased or decreased is plotted and approximated, and the calibration curve is calculated as correction data and stored in storage 50 together with the coefficients of the calibration curve. In this case, the calibration curve of each of the plurality of patterns that differ between the predetermined temperature or more and less than the predetermined temperature is calculated with the predetermined temperature (e.g. 25° C.) being set as the boundary, and the calibration curve is stored in storage 50 together with its coefficients.

In this embodiment, the calibration curve which is the correction data is a cubic curve of $y=a \times t^3 + b \times t^2 + c \times t$, and the cubic curve of each of the plurality of patterns is calculated. The coefficients a, b, and c of the cubic curve of each of the plurality of patterns are also stored in storage 50. For example, $y=a1 \times t^3 + b1 \times t^2 + c2 \times t$ is stored in storage 50 as the calibration curve of a first pattern, and $y=a2 \times t^3 + b2 \times t^2 + c2 \times t$ is stored in storage 50 as the calibration curve of a second pattern. The coefficients of the first pattern (a1, b1, c1) and the coefficients of the second pattern (a2, b2, c2) are also stored in storage 50 as the coefficients of the respective calibration curves.

In the operating state of inertial force sensor 100, temperature sensor 44 detects the ambient temperature of inertial force sensor 100 (acceleration detection element 20). Third ΔΣ AD converter 51 converts the signal related to the temperature information detected by temperature sensor 44 into a digital output signal, and digital low-pass filter 52 removes any noise signal from the digital signal. The resultant signal is fed to temperature signal offset adjustor 53.

Temperature signal offset adjustor 53 performs offset adjustment on the signal related to the temperature information received from temperature sensor 44 via third ΔΣ AD converter 51 and digital low-pass filter 52. After this, based on the offset-adjusted signal related to the temperature information, the coefficients of the calibration curve are extracted from storage 50 as the correction data corresponding to the signal related to the temperature information.

Here, the coefficients of the calibration curve are switched depending on the change of the ambient temperature of acceleration detection element 20. In detail, selector 54 selects a specific calibration curve from the calibration curve of each of the plurality of patterns stored in storage 50 and also selects specific coefficients from the coefficients of the calibration curve of each of the plurality of patterns stored in storage 50, depending on the ambient temperature of acceleration detection element 20. Selector 54 thus switches the coefficients of the calibration curve depending on the change of the ambient temperature of acceleration detection element 20.

For example, in the case where the ambient temperature of acceleration detection element 20 is less than 25° C., selector 54 selects the calibration curve of the first pattern ($y=a1 \times t^3 + b1 \times t^2 + c1 \times t$) as the correction data, and selects the coefficients of the calibration curve of the first pattern (a1, b1, c1). In the case where the ambient temperature of acceleration detection element 20 is 25° C. or more, on the other hand, selector 54 selects the calibration curve of the second pattern ($y=a2 \times t^3 + b2 \times t^2 + c2 \times t$) as the correction data, and selects the coefficients of the calibration curve of the second pattern (a2, b2, c2).

Temperature correction calculator 55 then calculates a correction value for correcting the output signals from first ΔΣ AD converter 47 and second ΔΣ AD converter 48, based on the temperature information which is the output signal from temperature signal offset adjustor 53 via digital low-pass filter 52 and the specific coefficients selected by selector 54.

Figure 5:
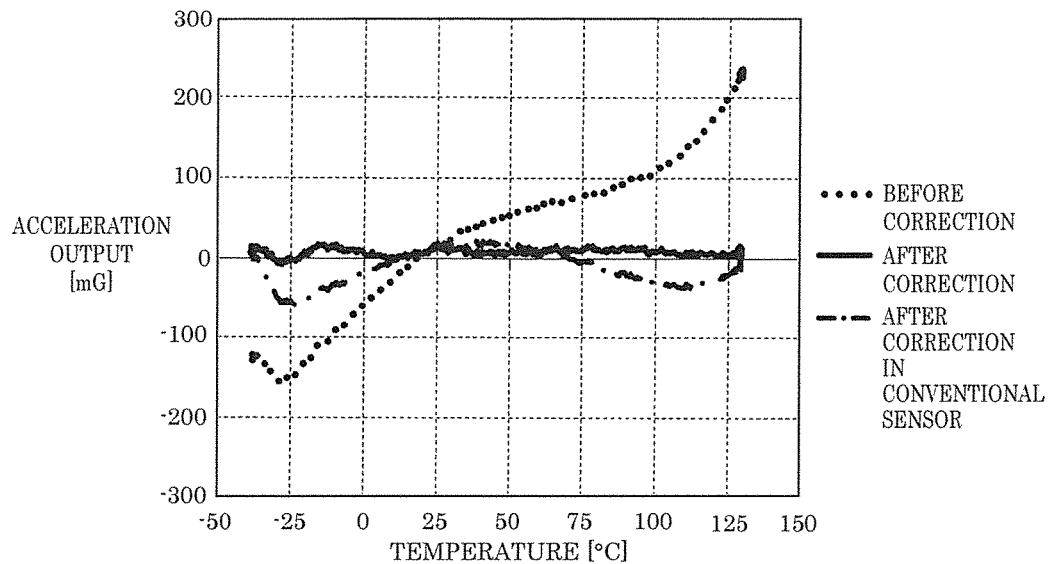
FIG. 5 is a diagram illustrating the output signal before and after correction when correcting the output signal depending on the temperature change of the inertial force sensor.
Figure 5:
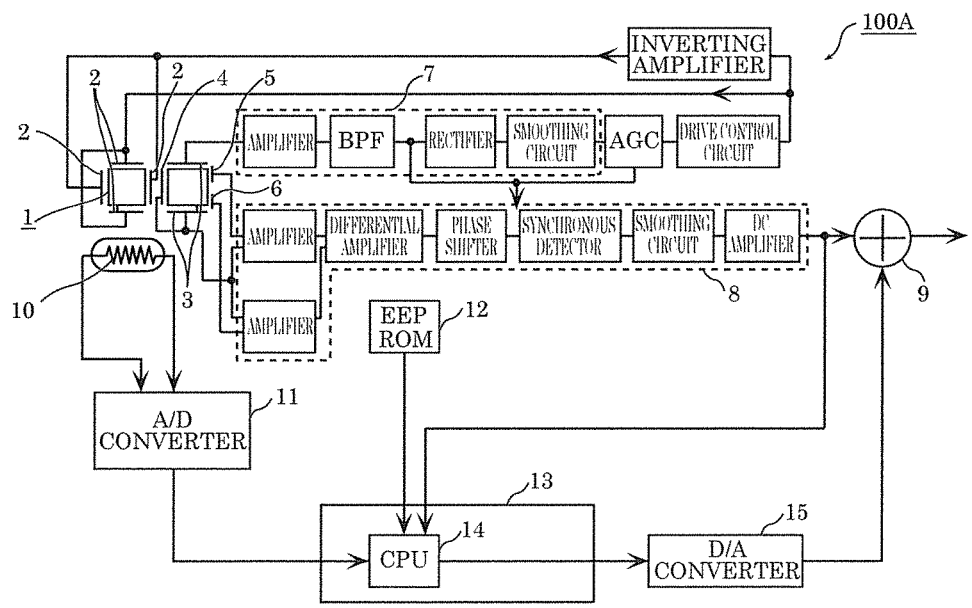

The correction value calculated by temperature correction calculator 55 is added to calculation circuit 49. Calculation circuit 49 corrects the output signals from first ΔΣ AD converter 47 and second ΔΣ AD converter 48 based on the correction value calculated by temperature correction calculator 55, as illustrated in FIG. 5. FIG. 5 is a diagram illustrating the output signal before and after correction, when correcting the output signal depending on the temperature change of inertial force sensor 100. FIG. 5 also illustrates the output signal after correction in conventional inertial force sensor 100A.

As described above, in inertial force sensor 100 in this embodiment, the correction data for correcting the variation in each of the output signal from first ΔΣ AD converter 47 and the output signal from second ΔΣ AD converter 48 due to the temperature change is a calibration curve that is a cubic curve, and the coefficients of the calibration curve are selected from the coefficients of the calibration curve of each of the plurality of patterns that differ between the predetermined temperature or more (e.g. 25° C. or more) and less than the predetermined temperature (e.g. less than 25° C.). In other words, the coefficients of the calibration curve as the correction data are changed at the predetermined temperature as the boundary. The coefficients of the calibration curve of each of the plurality of different patterns are stored in storage 50 beforehand.

Thus, the specific coefficients are selected from the coefficients of the calibration curve (cubic curve) of each of the plurality of patterns in storage 50 depending on the change of the ambient temperature of inertial force sensor 100 (acceleration detection element 20), and the output signal from first ΔΣ AD converter 47 and the output signal from second ΔΣ AD converter 48 are corrected based on the coefficients.

By correcting the output signal from first ΔΣ AD converter 47 and the output signal from second ΔΣ AD converter 48 depending on the temperature change using the coefficients of the calibration curve that is a cubic curve in this way, sextic correction can be performed in a pseudo manner. Sextic correction of high accuracy can thus be achieved with a small circuit size and a small amount of computation.

While inertial force sensor 100 according to the present invention has been described above by way of the embodiment, the present invention is not limited to the foregoing embodiment.

For example, although the calibration curve is a cubic curve in the foregoing embodiment, the calibration curve may be a quadratic curve. In this case, while using the quadratic curve as the correction data as in the conventional technique, quartic correction can be performed in a pseudo manner. Quartic correction of high accuracy can thus be achieved with a small circuit size and a small amount of computation.

Although two acceleration detectors (first acceleration detectors 31 and 32, second acceleration detectors 33 and 34) are used to detect acceleration in the two axial directions, i.e. the X-axis direction and the Y-axis direction, along with two bridge circuits (first bridge circuit 41, second bridge circuit 42) and two ΔΣ AD converters (first ΔΣ AD converter 47, second ΔΣ AD converter 48) in the foregoing embodiment, this is not a limitation, and acceleration in one axial direction may be detected. In this case, the number of acceleration detectors, the number of bridge circuits, and the number of ΔΣ AD converters may each be one.

Although inertial force sensor 100 detects acceleration in the foregoing embodiment, this is not a limitation.

Other modifications obtained by applying various changes conceivable by a person skilled in the art to the foregoing embodiment and any combinations of the structural elements and functions in the foregoing embodiment without departing from the scope of the present invention are also included in the present invention.

In inertial force sensor 100, the processing units such as temperature signal offset adjustor 53 and temperature correction calculator 55 may be realized by circuitry. In this case, the processing units may be realized by one circuit as a whole, or by separate circuits.

The processes described as operations in the processing units such as temperature signal offset adjustor 53 and temperature correction calculator 55 may be executed by a computer. For example, the processes can be executed by the computer executing a program using hardware resources such as a processor (CPU), memory, and an input/output circuit. In detail, the processes are executed by the processor acquiring processing target data from the memory, the input/output circuit, or the like, calculating the data, and outputting the calculation result to the memory, the input/output circuit, or the like.

The program for executing the processes may be stored in storage 50 or a recording medium other than storage 50.

INDUSTRIAL APPLICABILITY

The inertial force sensor according to the present invention has the advantageous effect of achieving higher-degree correction of higher accuracy without an increase in circuit size and an increase in computation amount, and so is useful as an inertial force sensor used in a vehicle, a mobile terminal, and the like.

REFERENCE MARKS IN THE DRAWINGS 20 acceleration detection element
31, 32 first acceleration detector
33, 34 second acceleration detector
41 first bridge circuit
42 second bridge circuit
44 temperature sensor
47 first ΔΣ AD converter
48 second ΔΣ AD converter
49 calculation circuit
50 storage
51 third ΔΣ AD converter
52 digital low-pass filter
53 temperature signal offset adjustor
54 selector
55 temperature correction calculator
100 inertial force sensor

The invention claimed is:

1. An inertial force sensor comprising:
a detection element;
a temperature sensor that detects an ambient temperature of the detection element;
a bridge circuit that processes an output signal from the detection element;
an AD converter that converts an analog signal output from the bridge circuit into a digital output signal, and outputs the digital output signal;
a calculation circuit that performs calculation on the output signal from the AD converter based on stored correction data; and
a storage that stores correction data for correcting a variation in the digital output signal from the AD converter due to a temperature change,
wherein;
the correction data is a calibration curve that is a quadratic or higher-degree curve,
the storage stores plural sets of coefficients for the calibration curve, including a first set of coefficients to be used in the quadratic or higher-degree curve when the ambient temperature detected by the temperature sensor is greater than or equal to a predetermined temperature, and a second set of coefficients to be used in the quadratic or higher-degree curve when the ambient temperature detected by the temperature sensor is less than the predetermined temperature, and the first set of coefficients is different from the second set of coefficients.

2. The inertial force sensor according to claim 1, further comprising a selector, which selects specific coefficients from the coefficients in the storage, depending on the ambient temperature detected by the temperature sensor.

3. The inertial force sensor according to claim 2, further comprising a temperature correction calculator which calculates a correction value for correcting the output signal from the AD converter, based on the ambient temperature detected by the temperature sensor and the specific coefficients selected by the selector.

4. The inertial force sensor according to claim 3, wherein the calculation circuit corrects the digital output signal from the AD converter, based on the correction value calculated by the temperature correction calculator.

5. An inertial force sensor comprising:

a detection element;

a temperature sensor that detects an ambient temperature of the detection element;

a bridge circuit that processes an output signal from the detection element;

an AD converter that converts an analog signal output from the bridge circuit into a digital output signal, and outputs the digital output signal;

a calculation circuit that performs calculation on the output signal from the AD converter; and a storage that stores correction data for correcting a variation in the digital output signal from the AD converter due to a temperature change, wherein the correction data includes a first calibration curve, having a first coefficient, and a second calibration curve, having a second coefficient different from the first coefficient, that are a quadratic or higher-degree curve, and wherein the calculation circuit calculates based on the first calibration curve when the detected ambient temperature is less than the predetermined temperature and calculates based on the second calibration curve when the detected ambient temperature is greater than or equal to the predetermined temperature, wherein the correction data include a calibration curve that is a quadratic or higher-degree curve, and the storage stores first coefficients applied to the calibration curve when the ambient temperature detected by the temperature sensor is less than the predetermined temperature, and second coefficients, that is different from the first coefficient, applied to the calibration curve when the ambient temperature detected by the temperature sensor is greater than or equal to the predetermined temperature.

* * * * *